(12) United States Patent
Trojan

(10) Patent No.: US 9,687,111 B1
(45) Date of Patent: Jun. 27, 2017

(54) VACUUM BLENDER

(71) Applicant: R. Joseph Trojan, Los Angeles, CA (US)

(72) Inventor: R. Joseph Trojan, Los Angeles, CA (US)

( * ) Notice: Subject to any disclaimer, the term of this patent is extended or adjusted under 35 U.S.C. 154(b) by 0 days.

(21) Appl. No.: 15/457,874

(22) Filed: Mar. 13, 2017

Related U.S. Application Data

(60) Provisional application No. 62/456,920, filed on Feb. 9, 2017.

(51) Int. Cl.
*A47J 43/046* (2006.01)
*A47J 43/07* (2006.01)
*B02C 18/12* (2006.01)

(52) U.S. Cl.
CPC ......... *A47J 43/0716* (2013.01); *A47J 43/046* (2013.01); *B02C 18/12* (2013.01)

(58) Field of Classification Search
CPC .................................................... A47J 43/046
USPC ........................................ 366/139, 205, 314
See application file for complete search history.

(56) References Cited

U.S. PATENT DOCUMENTS

| | | | |
|---|---|---|---|
| 2,463,886 A * | 3/1949 | Langmyhr | ................ B01F 7/30 366/139 |
| 2,683,379 A | 7/1954 | Strandgren | |
| 5,337,627 A | 8/1994 | Nakamura | |
| 2004/0173105 A1 | 9/2004 | Kim | |
| 2014/0137750 A1 | 5/2014 | Arai | |

FOREIGN PATENT DOCUMENTS

| | | |
|---|---|---|
| CN | 204120868 U | 1/2015 |
| EP | 3141169 A1 | 3/2017 |
| JP | 2013111079 A | 6/2013 |
| KR | 20090121537 A | 11/2009 |
| KR | 101441093 B1 | 9/2014 |
| KR | 20150145163 A | 12/2015 |
| KR | 101670026 B1 | 10/2016 |
| KR | 101673246 B1 | 11/2016 |
| KR | 101674164 B1 | 11/2016 |

* cited by examiner

*Primary Examiner* — David Sorkin
(74) *Attorney, Agent, or Firm* — Trojan Law Offices

(57) ABSTRACT

A vacuum blender having a vessel, a motor base containing a motor having a motor drive shaft, a blade holder having a blade with a blade shaft for engaging the motor drive shaft, and a fan connected to the motor drive shaft. The blender includes a conduit system for the passage of air from the vessel to an area in proximity to the fan before passing to the outside of the motor base. The conduit system is connected to a valve system, preferably including a three way valve or Venturi valve. The fan and blade are capable of being selectively actuated using a gear or clutch system, preferably operated by firmware. The invention is capable of evacuating air from the vessel before blending of the food contents occurs.

19 Claims, 23 Drawing Sheets

VACUUM BLENDER

CROSS-REFERENCE TO RELATED APPLICATION

This application claims the benefit of U.S. Provisional Patent Application No. 62/456,920, filed on Feb. 9, 2017.

FIELD OF THE INVENTION

The present invention relates to household and kitchen appliances. In particular, the invention relates to vacuum blenders, specifically relating to nutrient extractor vacuum blenders.

BACKGROUND OF THE INVENTION

Kitchen blenders have a motor base to which a vessel containing a combination of food items and liquid is mounted on top of the motor base. Such blenders are defined by the orientation of the vessel when attached to the motor base. Therefore, it is important to properly define the top and bottom of such vessels. The top of such vessels are defined as the end of the vessel at which the blended food and/or liquid enters the vessel for blending. The bottom of the vessel is the end of the vessel opposite the top of the vessel. The functionality of the top and bottom of the vessel is different, depending upon the type of kitchen blender involved.

In traditional kitchen blenders, a blade holder, in which a rotary blade is centrally integrated, is secured to the bottom of the vessel and a cap seals the top of the vessel to prevent the contents from splashing out of the vessel during blending. The blade of the vessel has a shaft that is capable of engaging the shaft of the motor contained in the motor base in a manner to permit activation of the blade.

Vacuum blenders are a subcategory of kitchen blenders, which remove the ambient air from the mixing vessel of the blender. The removal of the ambient air is desired because the air oxidizes nutritionally valuable antioxidant vitamins and nutrients when these bioactive ingredients are released during blending from the protective cell walls in which they are located. The health benefits of using the blender to release antioxidants will be increased if the nutritional value of such antioxidants can be preserved by removing the air from the vessel.

Other benefits of vacuum blenders include the removal of bubbles and foaming from the drink. When blended, the air is mixed into the drink. The gases added to the drink can cause discomfort to the consumer. The gases also make it more difficult to mix in protein powder to drinks. Foaming occurs when certain powder supplements are added to the mix, which has been known to cause additional strain on the motor, which can shorten the life of the blender. Vacuum blenders have also been shown to chop the ingredients into a finer consistency, which is a goal of making a nutritious smoothie.

Vacuum blenders typically have a valve in the top of the cap at the top of the vessel, which is secured to a passage, such as a hose, that is connected to a separate suction pump, which permits the removal of the air in the vessel. These types of vacuum blenders require costly structural additions to the blender to achieve these results, such as the addition of a vacuum pump. Generally, more material resources make them more costly to manufacture. Many vacuum blenders increase the footprint of the blender to accommodate the additional apparatus required to evacuate the vessel. The additional bulkiness requires larger packaging and increases the weight, thereby limiting the number that can be shipped and stored within a defined space. Heavier and bulkier items are generally more costly to ship. Many such vacuum blenders require more counter space, which is a disadvantage for many consumers. A typical vacuum blender having a separate vacuum pump can be found in United States Publication No. 2004-0173105 A1.

The configuration of a traditional vacuum blender described above does not work for a certain subset of blenders called nutrient extractors, or sometimes called single serve blenders. In such blenders, the vessel configuration is inverted. The top of the vessel does not have a cap. Instead, a blade holder is attached to the top of the vessel. The bottom of the vessel is completed closed and is fully integrated into the sides of the vessel. The food contents are placed inside the vessel, then the blade holder is attached to the top of the vessel thereby sealing the food contents inside for blending. The vessel and blade holder are inverted resulting in the top becoming the bottom so that the blade holder can be placed on to the motor base to permit activation of the blade. There is no cap in such a configuration to which a vacuum connection can be made. Since the bottom of such a nutrient extractor vessel is continuous with the walls of the vessel, a valve for a vacuuming tube cannot be incorporated into the bottom without compromising the integrity of the bottom of the vessel, which could result in leakage through the valve or leakage about the seal around the valve when the vessel is re-inverted after blending.

For kitchen blenders having the inverted configuration of a nutrient extractor, it is difficult to add the vacuum function. The problem arises with evacuating the air from nutrient extractors because the air in the vessel is located above the water line in the enclosed bottom of the vessel, which is the top of the vessel when the vessel is inverted for blending. It is comparable to an air pocket in a capsized ship. The present invention is able to evacuate the air from this sealed space without drilling a hole through the bottom to attach a vacuum pump. The present invention also avoids any substantial increase in the footprint of the blender, incorporating all inventive features within the existing spaces within the nutrient extraction blender, and taking advantage of the existing motor in such blenders to create the suction needed to evacuate the vessel.

Vacuum blenders with the opening for accessing the contents of the vessel on top can also benefit from the present invention. Such conventional vacuum blenders still have a separate vacuum pump separate from the motor that drives the blade. The vacuum pump is sometimes located within the motor base housing such as in Korean Patent No. 10-1441093. In other vacuum blenders, the vacuum pump is located separately from the motor base housing. But in either case, a separate motor drive is required to for evacuation of the vessel and blending with the blade. The present invention eliminates the need for a separate vacuum pump in a vacuum blender.

DETAILED DESCRIPTION OF THE INVENTION

The Invention's Conduit System

Figure 1:
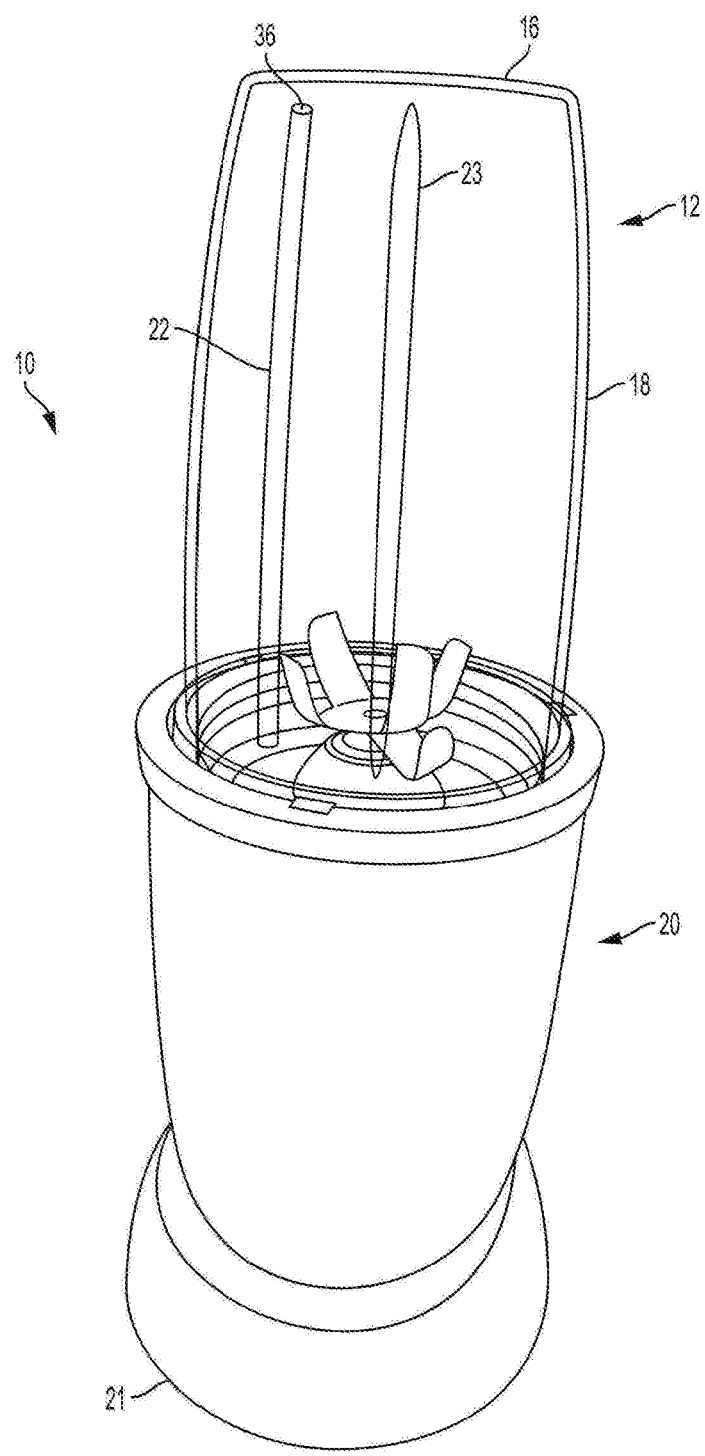
FIG. 1 is a perspective view of an assembled blender in accordance with an embodiment of the present invention.
Figure 2:
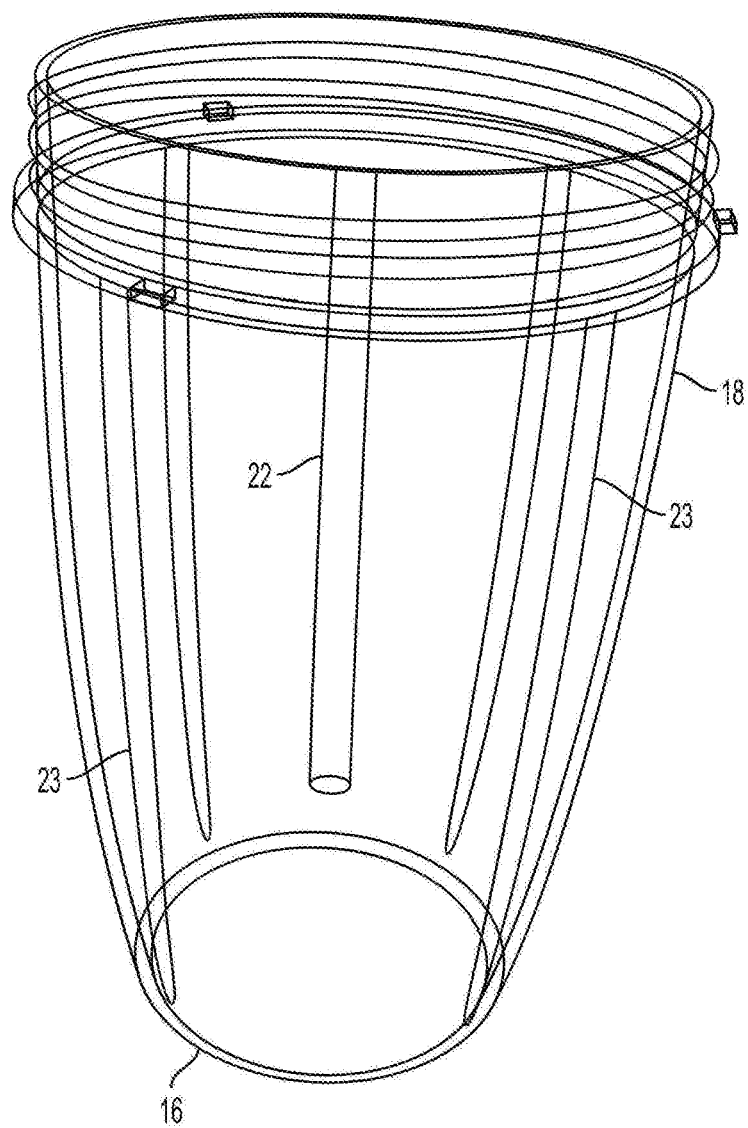
FIG. 2 is a perspective view of a vessel in accordance with an embodiment of the present invention.
Figure 3:
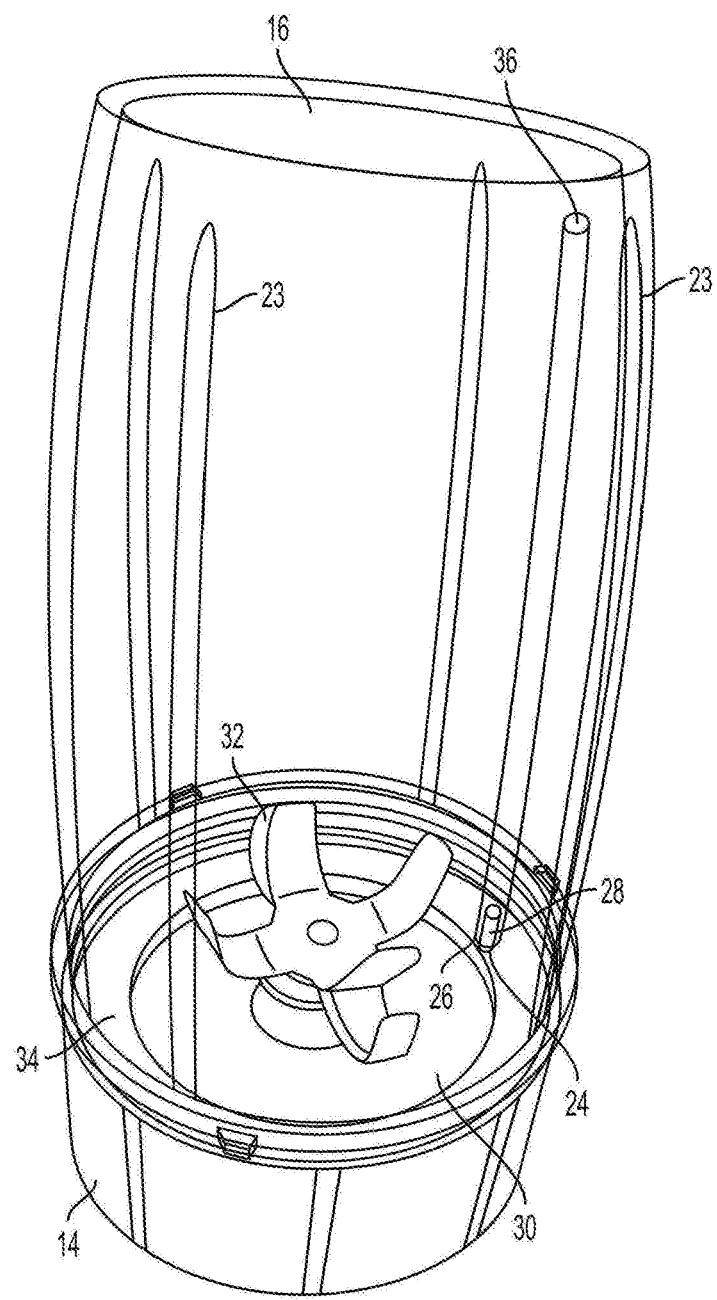
FIG. 3 is a perspective view of a vessel with a blade holder attached in accordance with an embodiment of the present invention.

As shown in FIGS. 1 to 3, a preferred embodiment of the invention is comprised of a blender 10 having a vessel 12 to which the blade holder 14 is attached to the top of the vessel 12 and the bottom 16 of the vessel is integral with the sidewalls 18 of the vessel 12. The blade holder 14 is capable of being detachably secured to a motor housing 20. The invention has a system of conduits from the bottom of the inverted vessel 12 to the bottom 21 of the motor housing 20. In the preferred embodiment, the vessel has at least one hollow vessel conduit or tube 22 formed in the wall of the vessel. The vessel conduit 22 has an opening 24 at the top of the vessel 12 as shown in FIG. 3. This opening has a first coupling 26 that can engage a second coupling 28 located in the blade holder 14.

Figure 4:
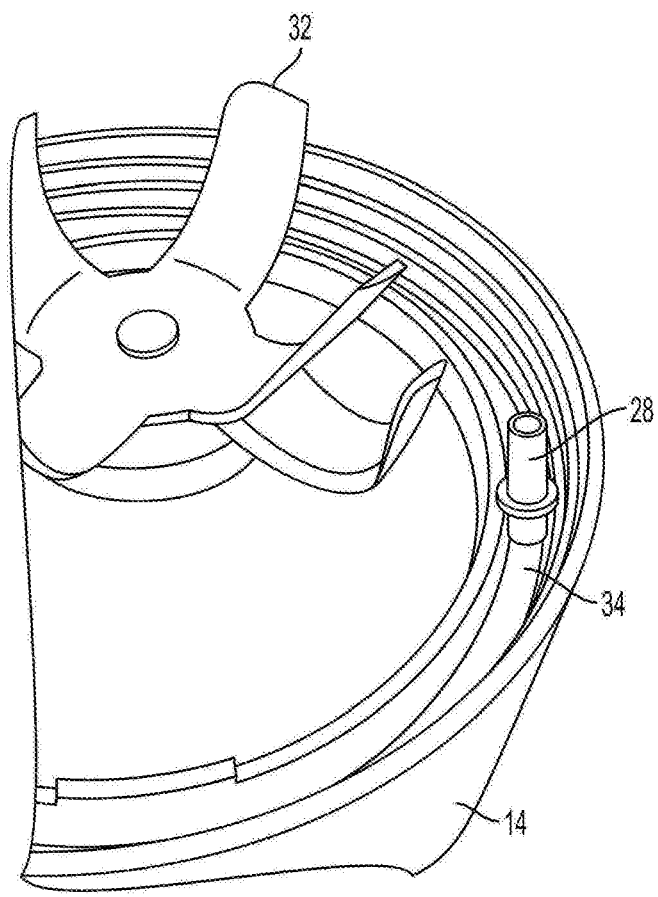
FIG. 4 is a top perspective view of a blade holder in accordance with an embodiment of the present invention.

The vessel conduit 22 also has an opening or aperture 36 in proximity to the bottom 16 of the vessel 12. The blade holder 14 has a plate 30 to which a rotatory blade 32 is centrally secured. The plate 30 has a first side 34 and a second side 36. The blade 32 protrudes from the first side 34 of the plate 30. The second side 36 of the plate 30 faces the motor housing 20 when mounted operationally to the motor housing 20. As shown in FIG. 4, the second coupling 28 is located on the first side 34 the plate 30 and passes through the plate 30. On the underside of the plate 30, the second coupling 28 is capable of engaging a third coupling 40 located on the motor base 20.

The vessel 12 can have ridges 23 formed in the walls of the vessel 12. The ridges 23 create turbulence when they protrude from the interior side of the sidewall 18 of the vessel 12, and can provide better griping of the vessel 12 when the ridges 23 protrude on the exterior of the sidewall 18 of the vessel. Whether the ridges 23 are protrude on the inside or the outside of the vessel or both side, the vessel conduit 22 can be formed within one or more of the ridges 23.

Figure 5:
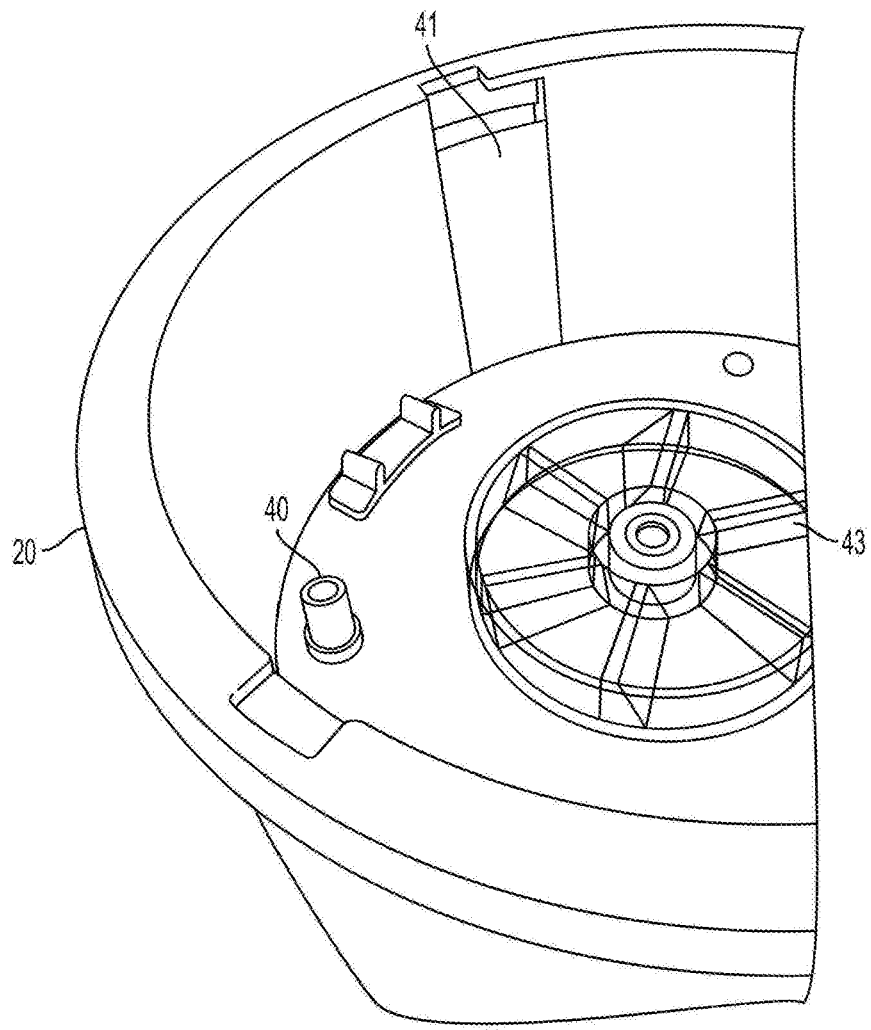
FIG. 5 is a top perspective view a motor base in accordance with an embodiment of the present invention.
Figure 10:
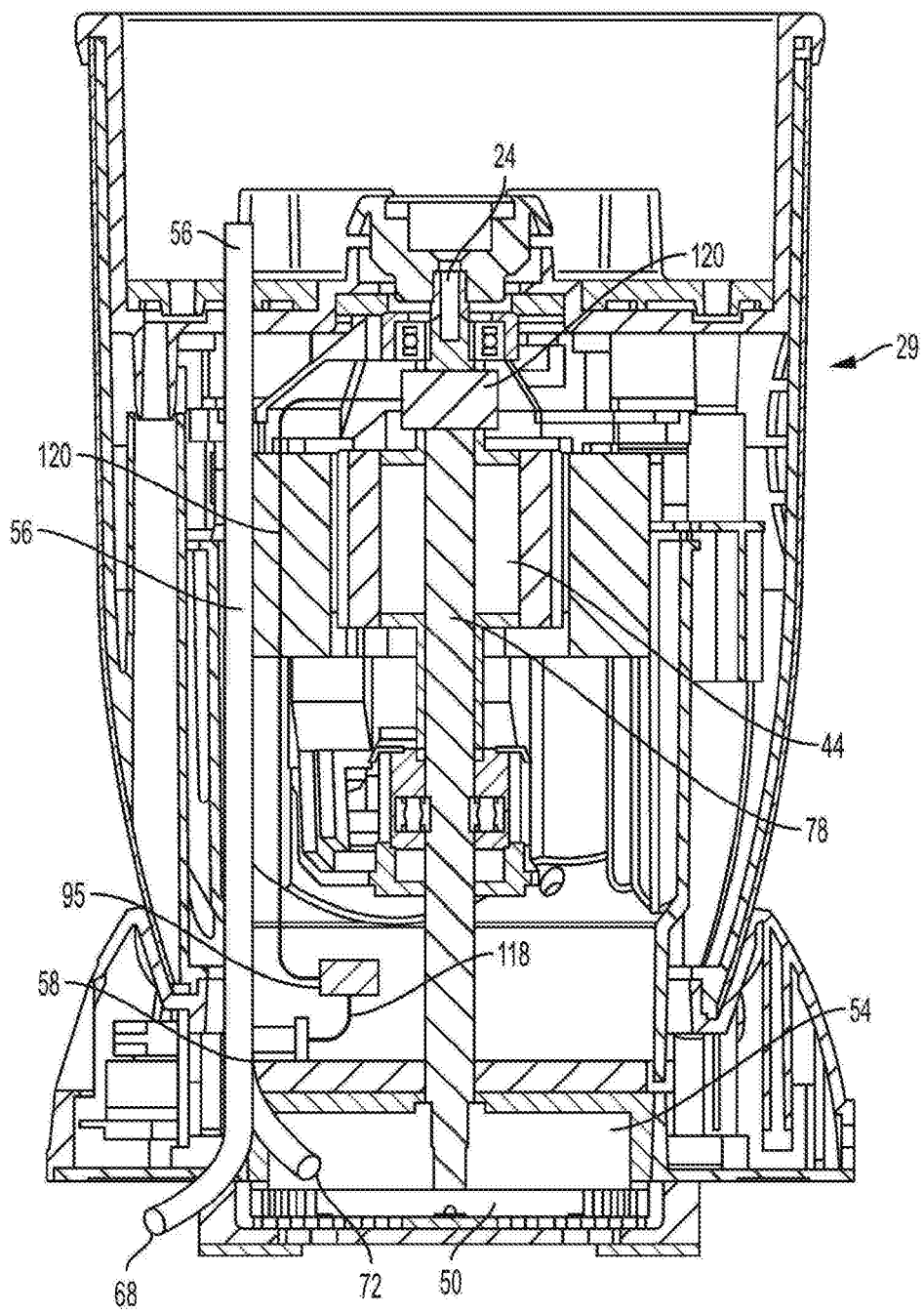
FIG. 10 is a cross sectional view of the motor base in accordance with an embodiment of the present invention.

The motor base 20 has a housing 42 in which a motor 44 is located. The housing contains at least the motor 44, a motor drive shaft 78 that engages a shaft 48 of the blade 32 via the clutch or gear system 120, and a fan 50 at the bottom of the motor. The blades 52 of the fan 50 are oriented to expel air from the motor housing 20 to cool the motor 44. The side of the fan 50 that draws air from inside the motor housing 20 is defined as an intake side 54. As shown in FIGS. 5 and 10, the third coupling 40 in the motor base 20 is connected to a descending conduit 56 that passes through the interior of the housing of the motor base 20.

The Invention's Valve System

Figure 6:
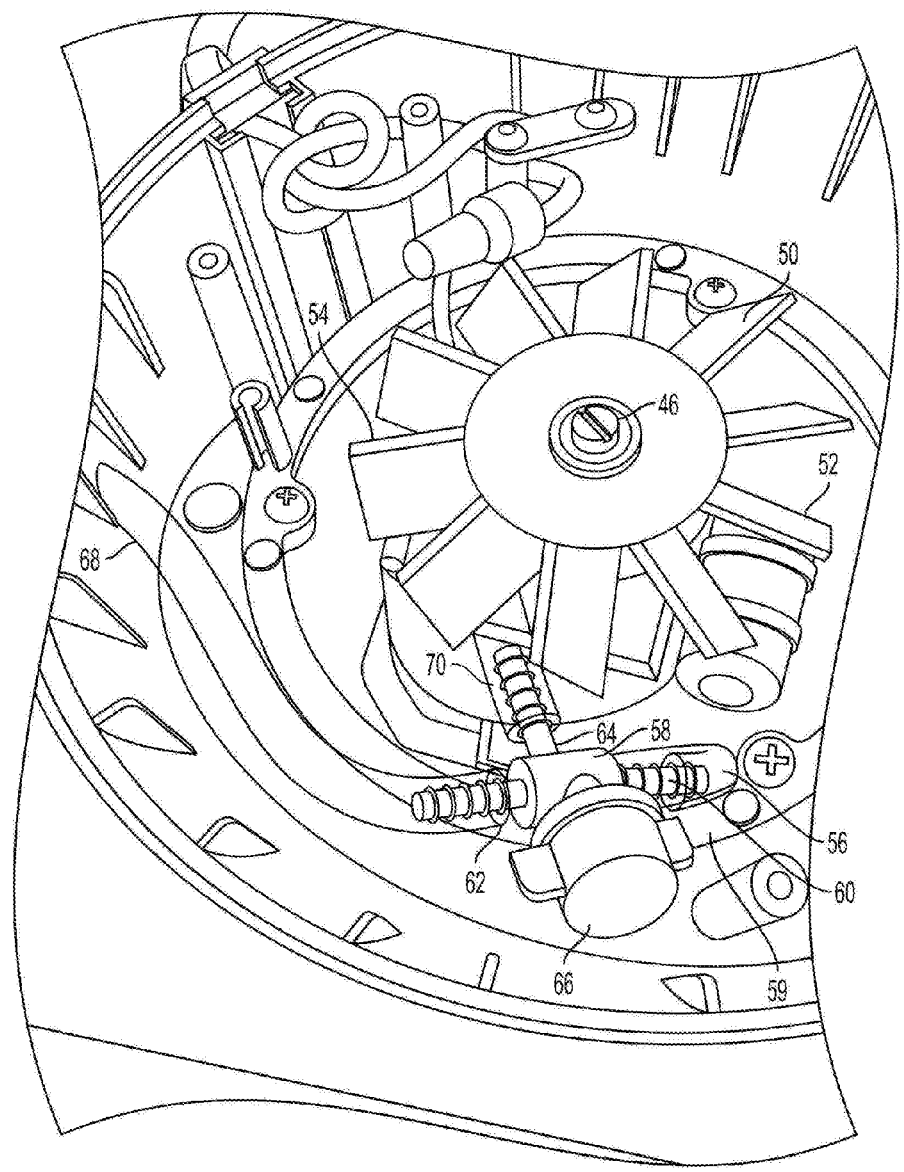
FIG. 6 is a bottom perspective internal view of the motor base in accordance with an embodiment of the present invention.
Figure 7:
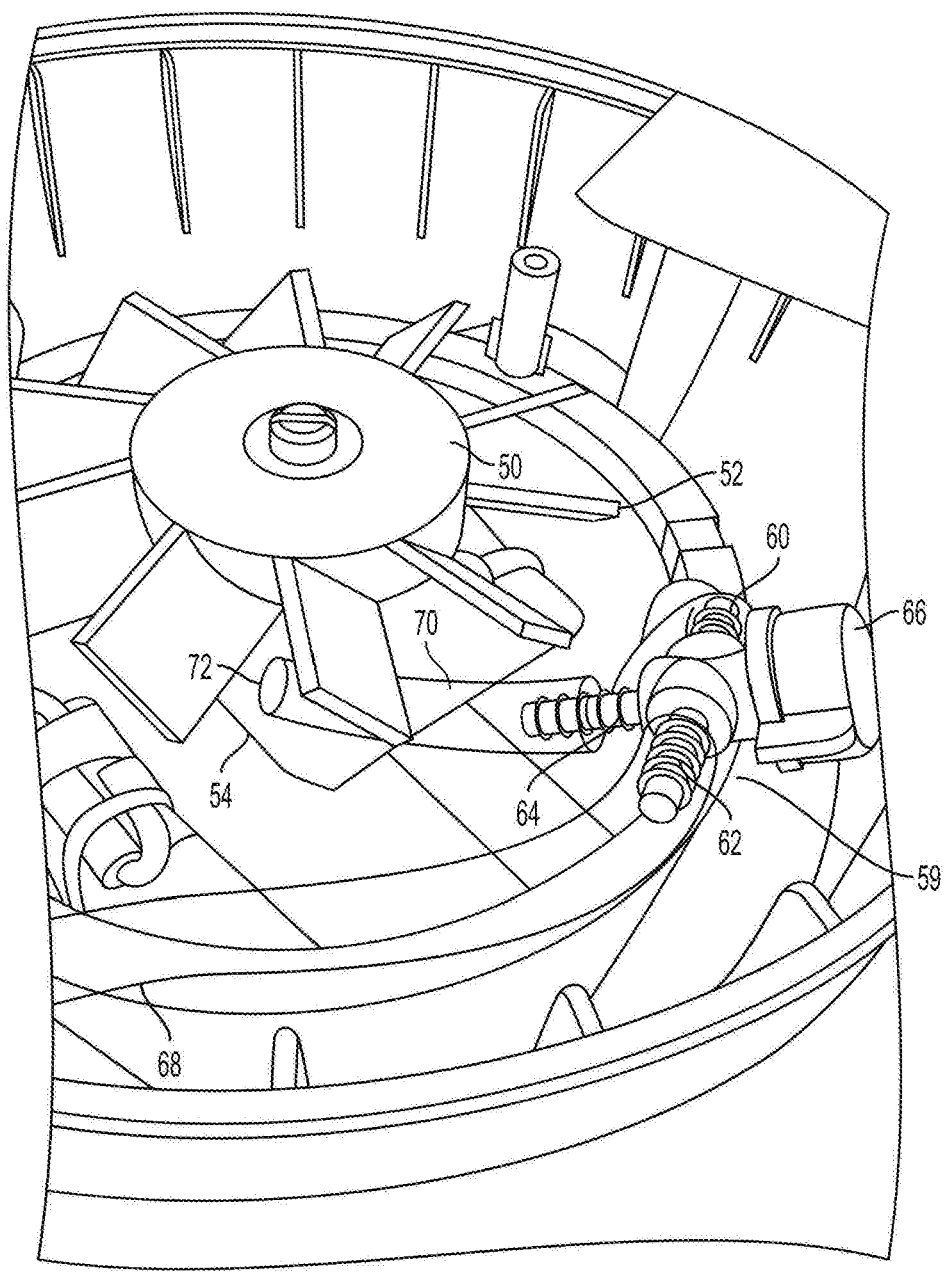
FIG. 7 is a bottom perspective internal view of the motor base in accordance with an embodiment of the present invention.

The descending conduit 56 is connected to a three way valve 58 shown in FIGS. 6 and 7. The three way valve 58 has an inlet coupling 60, an exhaust coupling 62, a vacuum coupling 64, and a flow switch 66. The flow switch 66 can be manually operated by positioning the three way valve 58 so that the switch 66 protrudes from the motor housing 20. This is collectively defined as a three way valve system 59. The preferable method of controlling the flow switch 66 is by an electro-mechanical device, such as a solenoid, that is on a timer or is controlled by firmware in a microcontroller. Controlling the flow switch 66 by using a mechanical timer, or by using an electromechanical device operated by a microcontroller, is well known in the art of flow switches.

The descending conduit 56 is connected to the inlet coupling 60 of the three way valve 58. The exhaust coupling 62 is connected to an exhaust conduit 68, which vents to the outside of the motor base housing 20. As shown in FIGS. 6 and 7, the vacuum coupling 64 is connected to a vacuum conduit 70, which is substantially perpendicular to the inlet conduit 60 and exhaust 64 conduit. The vacuum conduit 70 has a terminal end 72. The terminal end 72 is positioned on the intake side 54 of the fan 50 in the motor base 20 in an operational position so that the fan 50 sucks air from the terminal end 72 of the vacuum conduit 70. This creates a gas Venturi effect causing the air in the vessel 12 to be sucked out through the system of conduits via the vessel conduit 22 and the descending conduit 56 to be expelled through the exhaust conduit 68. The flow switch is in the open position after activation of the fan for long enough to expel the gas from the vessel. At that point, the blade is engaged by the motor to begin the blending process.

In a preferred embodiment, the descending, vacuum, and exhaust conduits 56, 70, 68 have a larger diameter than the corresponding inlet, vacuum and exhaust couplings 60, 62, 64 of the three way valve 58. This creates a Venturi effect by forcing air to travel at a higher speed through the narrower three way valve 58. The higher speed through the narrower valve 58 lowers the pressures in the valve. The lower pressure in such a Venturi valve draws air from the higher pressure descending conduit 56 until all air from the chamber has been vacuumed out.

A Venturi valve can also be constructed by simply having a narrower passage at any point in the conduit system. For example, the valve system would also work by joining the descending conduit 56 to the exhaust conduit 68 with a section of conduit that is narrower in diameter than both. Preferably, a valve would be added at any point to turn on and off the evacuation process. The exhaust conduit would terminate on the intake side 54 of the fan 50 in order to begin the draw of air through the system to set up the pressure differential for the Venturi effect. The disadvantage of this design is that any liquids inadvertently sucked through the conduit system would run the risk of hitting the fan and being projected back up on to the electric motor, which could cause a short circuit.

The vessel 12 can be formed with one or more vessel conduits 22. Each vessel conduit 22 can be operationally connected to its own valve system 59. The advantage of a plurality of such vessel conduits 22 with each having a dedicated valve system 59 is that it will decrease the time required to evacuate the vessel 12 because more than conduit 22 is simultaneously evacuating the vessel 22. Another advantage is if one conduit 22 becomes clogged, the other conduit 22 is still evacuating the vessel 12. The disadvantage is the additional cost and space constraints within the housing. The potential clogging of the vessel conduit 22 can be addressed by providing a plurality of vessel conduits 22 that are connected to a single conduit system in the motor base 20, which connects to a single valve system 22. Such an embodiment will not necessarily evacuate the vessel faster than a single vessel conduit 22, but it will insure redundancy such that if a vessel conduit 22 becomes clogged, the remaining vessel conduits 22 will continue to evacuate the vessel 12.

The conduit system has been described as internal to the vessel 12, blade holder 14, and motor housing 20. But it is within the scope of the invention to place all or part of the conduit system on the external side of the vessel 12, blade holder 14, and motor housing 20 or any effective combination thereof.

The Gear Mechanism for Operating the Blade Separately from the Fan

As shown in FIG. 10, the invention has a gear mechanism 120 in the motor base 20 to permit the motor to operate the fan without rotating the blade. The gear mechanism 120 can be a clutch system or an axial gear system. The clutch system can be a mechanical, electromechanical, or electro-magnetical clutch system as described below. The gear mechanism is important to the invention because the evacuation of the air from the vessel must be completed before the blade is activated. Otherwise, the vessel conduit would be sucking fluid and food particles out of the vessel along with air. Therefore, it is important to have a gear mechanism that allows the motor to activate the fan, but not the blade, when the valve system is in the open position.

The gear mechanism delaying activation of the timer can be mechanical in nature. Such mechanical gears are well known in the art of timers. Electromechanical timers can also control the closing of the valve 58 and the activation of the blade shaft 74. But preferably, the timing can be controlled by firmware located in a microcontroller. The delay before the flow switch 58 is closed and the blade shaft 74 is engaged will depend upon the length of time required to evacuate the vessel 12, taking into consideration such factors as the power of the motor, the size of the vessel 12, and the diameter of the conduits and couplings in the system.

The Spring Clutch Embodiment

Figure 11:
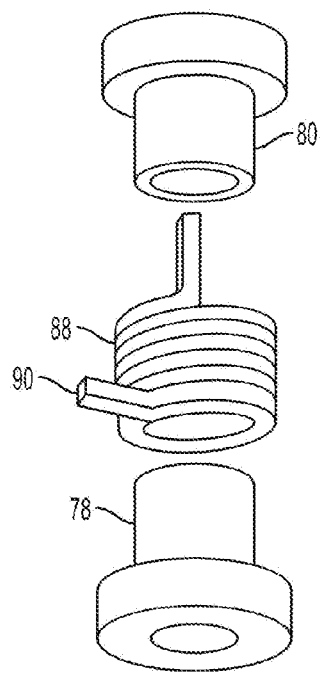
FIG. 11 is an exploded view of internal components spring clutch in accordance with an embodiment of the present invention.
Figure 12:
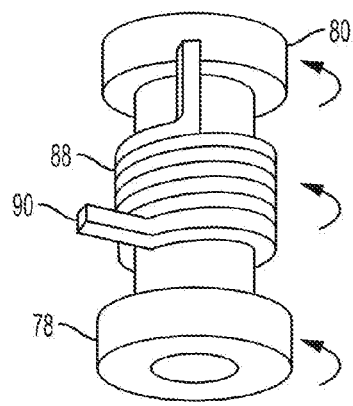
FIG. 12 is a perspective view of internal components of spring clutch in accordance with an embodiment of the present invention.
Figure 13:
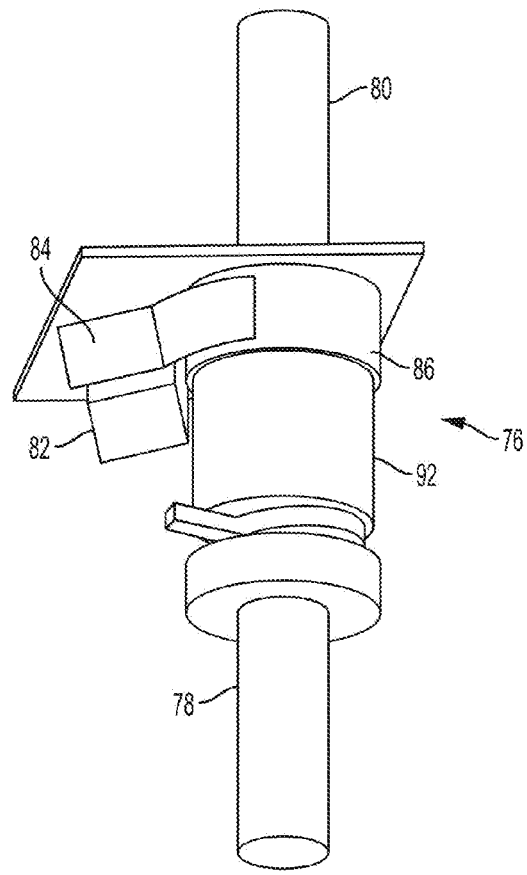
FIG. 13 is a perspective view of an assembled spring clutch in accordance with an embodiment of the present invention.

As shown in FIGS. 11 to 13, a spring clutch system 76 can be used to couple the motor shaft 78 (also known as a input shaft) to the blade shaft 80 (also known as a load shaft). The location of the spring clutch system is shown in FIG. 13 with the details of the spring clutch system shown in FIGS. 14, 15, and 16. Using a conventional spring clutch system 76, the motor shaft 78 is coupled to the blade shaft 80 when a solenoid 82 is activated to disengage a wrap spring 84 from a stop collar 86. This frees the stop collar 86, which is connected to the clutch spring 88 via the control tang 90. When this happens, the clutch spring 88 tightens, thereby coupling the motor shaft 78 and blade shaft 80 together. When power to the solenoid 82 is turned off, the solenoid arm retracts thereby permitting the wrap spring 84 to re-engage the stop collar 86 thereby disengaging the blade shaft 80 from the motor shaft 78. The clutch spring 88 is contained within clutch housing 92.

Modern blenders operate at significant rotational speeds of up to 20,000 to 25,000 revolutions per minute (RPM). Spring clutches are usually employed in lower RPM environments. But blenders are a special case because the load is generally reduced as a function of time. In a blender, the spring clutch 76 is not likely to be under high load at high RPM for a significant period of time given that the load is decreasing as the ingredients in the vessel 12 are converted from solid to substantially liquid form by the blade. This reduces stresses on the spring clutch.

To increase spring clutch performance, it is preferable that the motor shaft 78 come to a stop, or at least be reduced to a speed approaching zero RPM, before the clutch engages the motor and blade shafts 78, 80. To further increase spring clutch 88 performance, the engagement portions of the motor shaft 78, the blade shaft 80 and/or the clutch spring 88, or combinations thereof, can be coated with tungsten carbide (WC), aluminum oxide ($Al_2O_3$), chromium nitride (CrN), titanium diboride ($TiB_2$), silicon dioxide ($SiO_2$), and/or combinations thereof. These coatings provide a harder surface for engagement. There are also various bonding material powders available for increasing the performance of the clutch system such as NiCrAlY, NiCrAl, NiCr, and Ti, which may be suspended in a liquid medium and then cold sprayed or brushed onto the plate, or they may be applied by an high velocity oxygen fuel (HVOF) or air fuel (AF) thermal spray procedure. Ceramic coatings can also be used made from a mixture of copper, iron, tin bronze, silicon dioxide, and/or graphite. Organic coatings are also suitable and are typically made from phenolic resins, friction modifiers like metallic powder or metal oxides, and compounded rubber. All of these bonding materials and coatings reduce slippage of the clutch during operation by increasing the frictional coefficient at the points of contact of the clutch system with the drive shaft of the blade.

Rotary Gear Clutch Embodiments

Figure 14A:
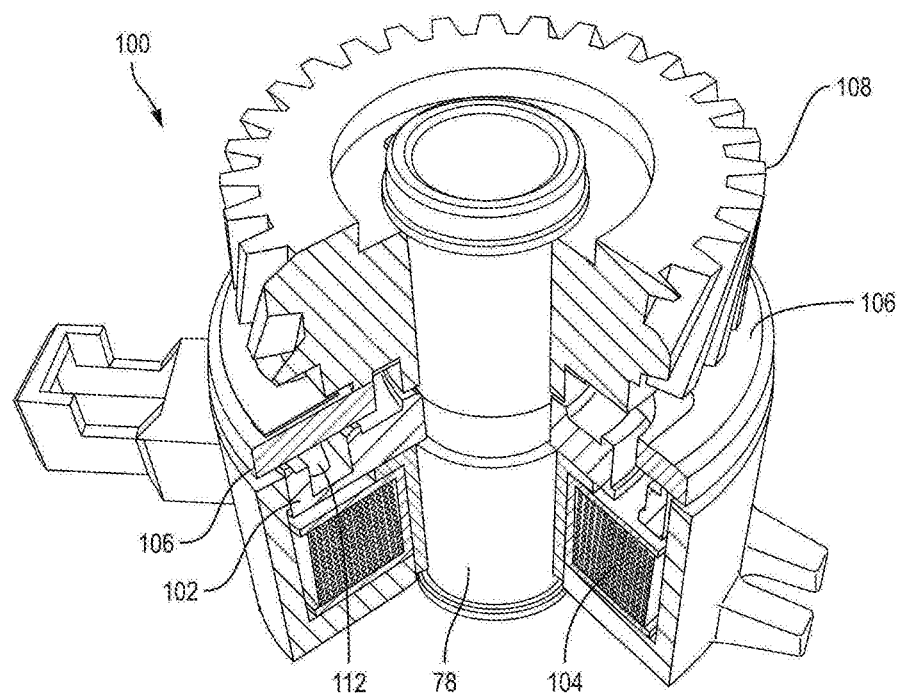
FIG. 14A is a dissected perspective view of an electromechanical clutch in accordance with an embodiment of the present invention.
Figure 14B:
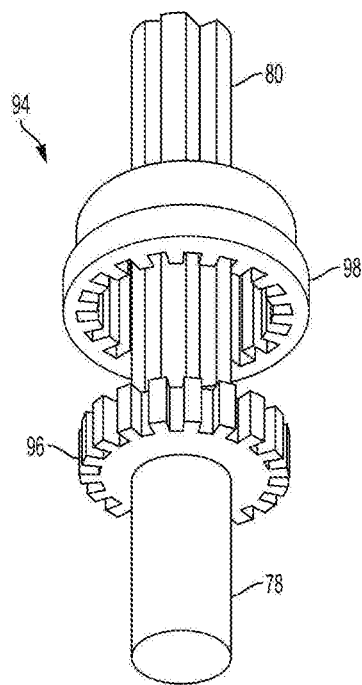
FIG. 14B is an exploded view of a gear coupling in accordance with an embodiment of the present invention.

As shown in FIG. 14B, a rotary gear mechanism 94 can also couple the motor shaft to the blade shaft using an electromechanical clutch. In one such embodiment of a rotary gear mechanism, a male gear 96 secured to the motor shaft 78 is capable of engaging a complementary female gear 98 located secured to the blade shaft 80. The engagement of the male and female gears 96, 98 can be controlled using conventional electromechanical clutches or solenoids to provide linear movement of the motor shaft 78. Such linear movement of the motor shaft can be accomplished by a telescoping drive shaft. Such telescoping drive shafts can be controlled by a spring loaded solenoid, rack and pinion system, or screw drive system, some examples of which are discussed below.

A telescoping drive shaft can have an internal member having threads about the circumference of the member and an outer sheath having complimentary grooves for receiving the threads. The outer sheath can be biased by a spring in the contracted position and engaged by a solenoid controlled by firmware sending a signal from a printed circuit board (PCB) 95 when it is desired for the rotary gear mechanism 94 to engage the blade shaft gear 98. PCB's are found within many blenders and used for controlling the blending cycle. Or the electromagnetic clutch can couple the motor and blade shafts by sending a signal from a simple on and off switch. It is preferable that after the motor 44 has been activated to evacuate the vessel 12 using the valve 58, the motor should be reduced to zero RPM before the clutch engages the shafts. This reduces stresses on the rotary gear mechanism 94. In fact, it is better for all gear and clutch systems described herein if the RPM is reduced to zero before engaging the blade drive shaft.

An Electromagnetic Clutch Embodiment

Another clutch mechanism that can be used with the invention is an electromagnetic clutch 100 as shown in FIG. 14A. The electromagnetic clutch 100 has a rotor 102 to which the motor shaft 78 is secured within. An electric coil 104 is radially positioned about the rotor 102. In the present invention, the motor 44 is positioned below the electromagnetic clutch 100, which means the electric coil 104 is above the motor 44. Above the electric coil 104 is an armature 106, which is secured to an output gear 108. The output gear 108 is able to engage a blade shaft 24 at the bottom of the blade holder 14. Springs 112 bias the armature 106 above the electric coil 104. At least one gap 114 is located between the electric coil 104 and the armature 10 in which a magnetic flux is created when power is delivered to the electric coil 104. The flux attracts the armature 106 to the rotor 102 thereby magnetically securing the armature 106 and the rotor 102 together, which transfers the rotary motion of the motor shaft 78 to the blade shaft 24. Such an electromagnetic clutch 100 can be controlled by the blender's PCB 95 by turning on and off power to the coil 104. Improved performance of the electromagnetic clutch 100 can also be achieved using the same coatings and bonding powders described with respect to the use of a spring clutch 76 in the invention. Such materials can be applied to the armature 106 and/or the rotor 102 at the surface interface between the armature 106 and rotor 102.

Electromagnetic Clutch Embodiments Using Bar Armatures

Figure 16:
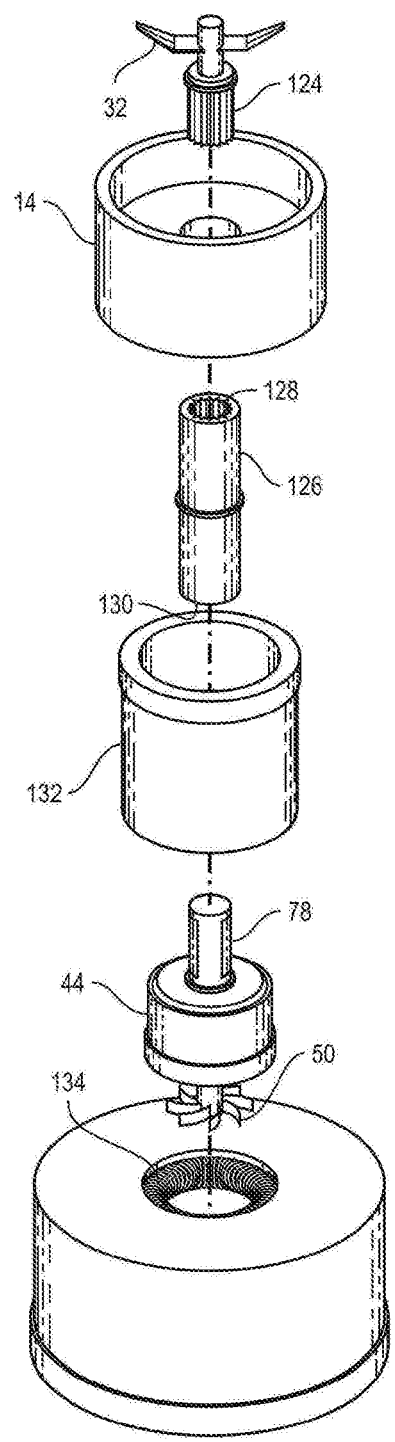
FIG. 16 is an exploded view of an electromagnetic clutch in accordance with an embodiment of the present invention.

FIGS. 16 to 24, show variations on a particular electromagnetic clutch system, which can be used with the invention. FIG. 16 generally shows the conventional blade holder having a blade 32 with a standard blade coupling 124. But rather than the blade coupling engaging the motor drive shaft 78 directly, the blade coupling 124 engages an upper terminal end 128 of a clutch shaft 126. An upper portion of the clutch shaft 126 is surrounded by a clutch housing 132. A lower terminal end 130 of the clutch shaft 126 engages the motor drive shaft 78, which is driven by motor 44. The motor drive shaft 78 also spins fan 50. Electromagnetic coil 134 surrounds the lower portion of the clutch shaft 126 in which motor shaft 78 is received as shown in FIGS. 17 to 24. The motor shaft 78 is specially adapted with at least one, but preferably a plurality of storage chambers 136 in which a magnetic or magnetizable bar armature 138 is mounted in each storage chamber 136 using a spring mechanism 140.

Figure 17:
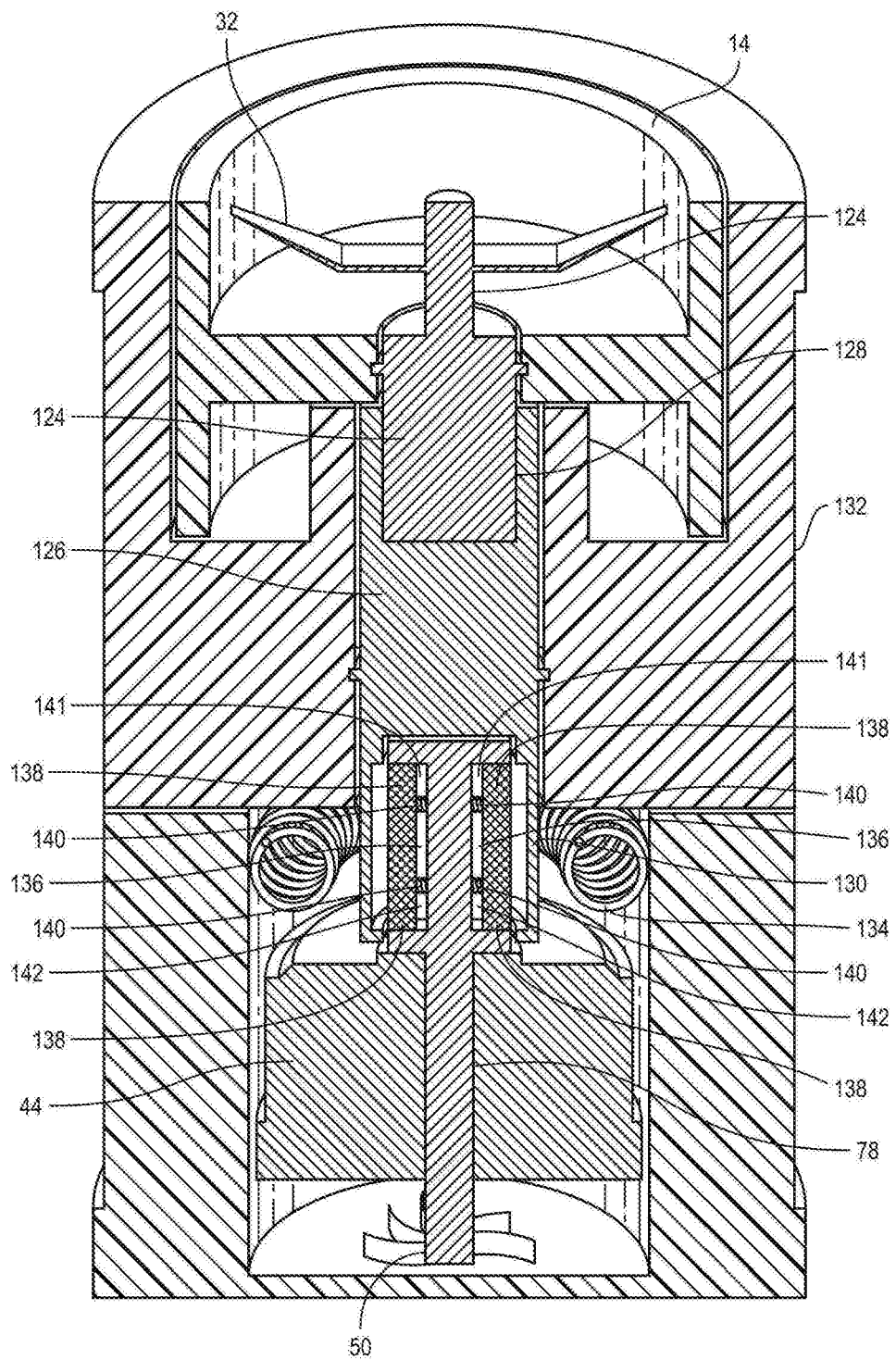
FIG. 17 is a cross sectional perspective view of a gear clutch in accordance with an embodiment of the present invention.
Figure 19:
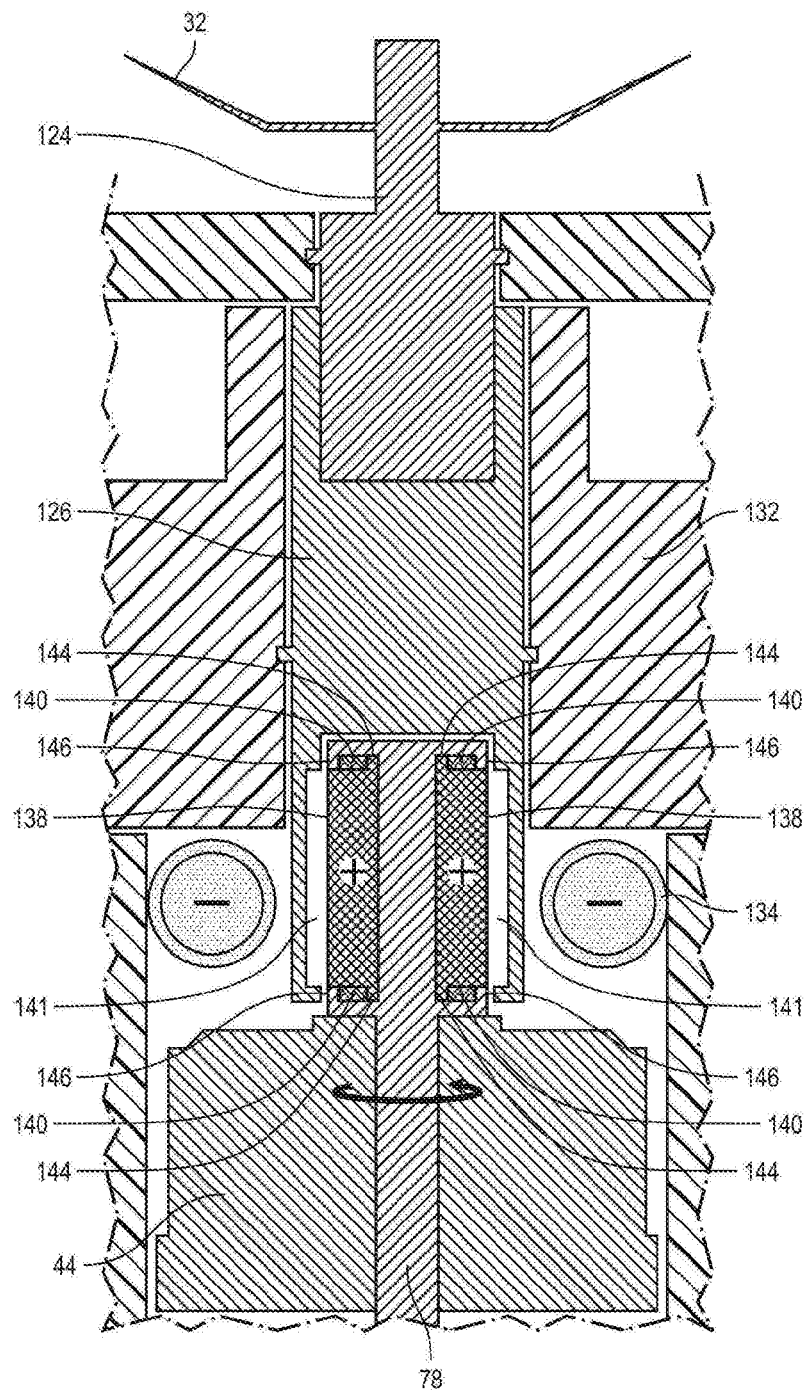
FIG. 19 is a cross sectional view of an electromagnetic clutch in accordance with an embodiment of the present invention.
Figure 20:
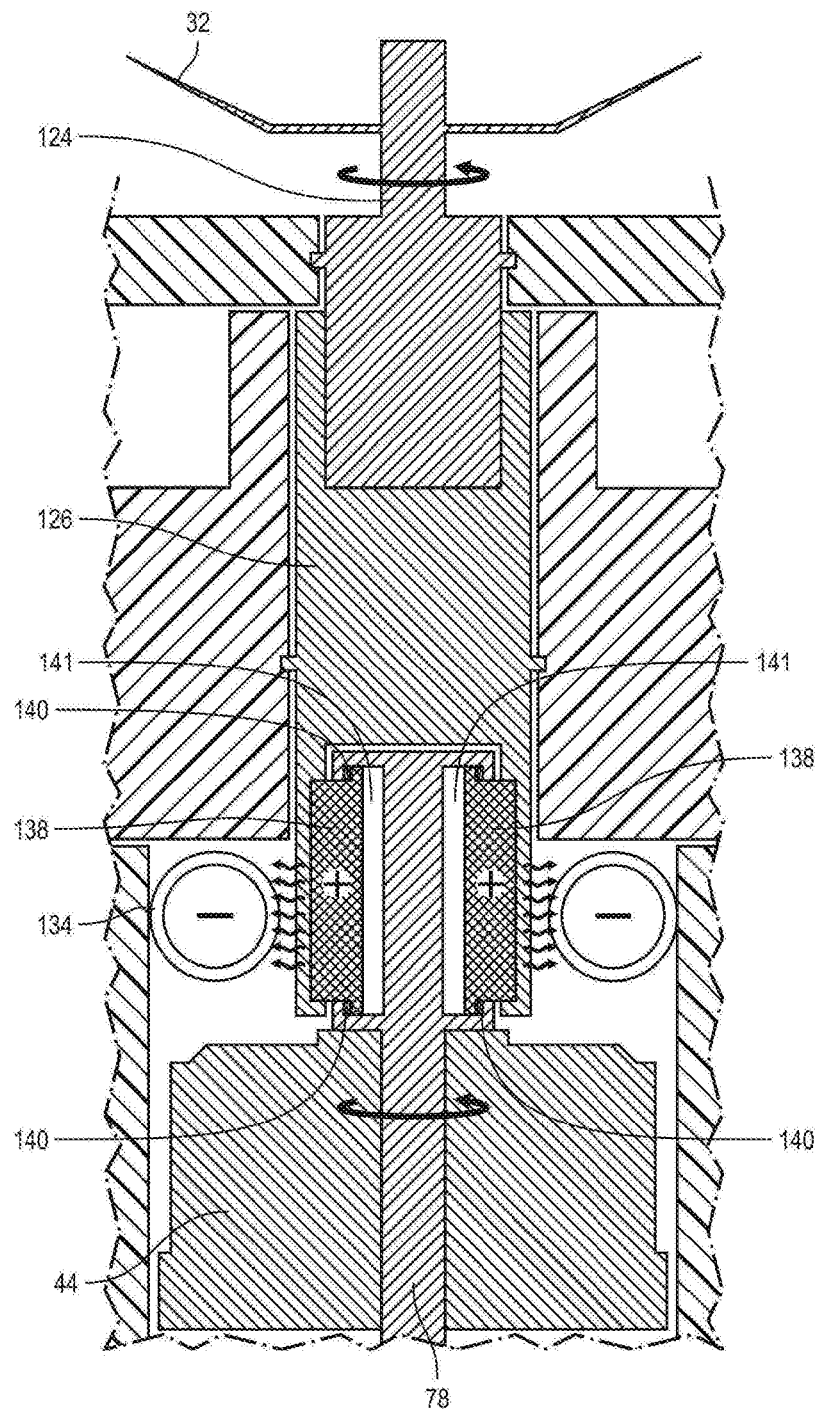
FIG. 20 is a cross sectional view of an electromagnetic clutch in accordance with an embodiment of the present invention.

The spring mechanism 140 can be a coiled spring, a leaf spring or any other resilient mechanism capable of holding the bar armatures 138 within the storage chambers 136. When the bar armatures 138 are held within the storage chambers 136 by the spring mechanisms 140, then the motor shaft 78 will spend the fan 50 without spinning the blade 32 as shown in FIGS. 17 and 19. During this phase, the vessel 12 can be evacuated. When the coil 134 is energized, a portion of each bar armature 138 is drawn into a clutch chamber 141 on the clutch shaft 126 with a portion of each bar armature remaining in its storage chamber 136 as shown in FIGS. 18 and 20.

The clutch chambers 140 can be bigger than the storage chambers 136 so that a storage chamber 136 is usually facing a clutch chamber 141. As a consequence, when a bar armature 138 is drawn into a clutch chamber 141, the drive shaft 78 will spin the bar armature 138 until it hits a side wall of the clutch chamber 141, at which point the clutch shaft 126 will be fully engaged. In this fully engaged position, the drive shaft 78 is joined to the clutch shaft 126 in order to permit the blade 32 to rotate. If the magnetic attraction is strong enough, movement of the blade 32 may occur without rotational slippage of the bar armatures 138 against the side walls of the clutch chambers 140. The electromagnetic coil 134 can be controlled by programming in a PCB 95 to activate the coil 134 after a predetermined time has lapsed, usually 10 to 20 seconds, during which the vessel 12 is evacuated before the blade is engaged.

Figure 18:
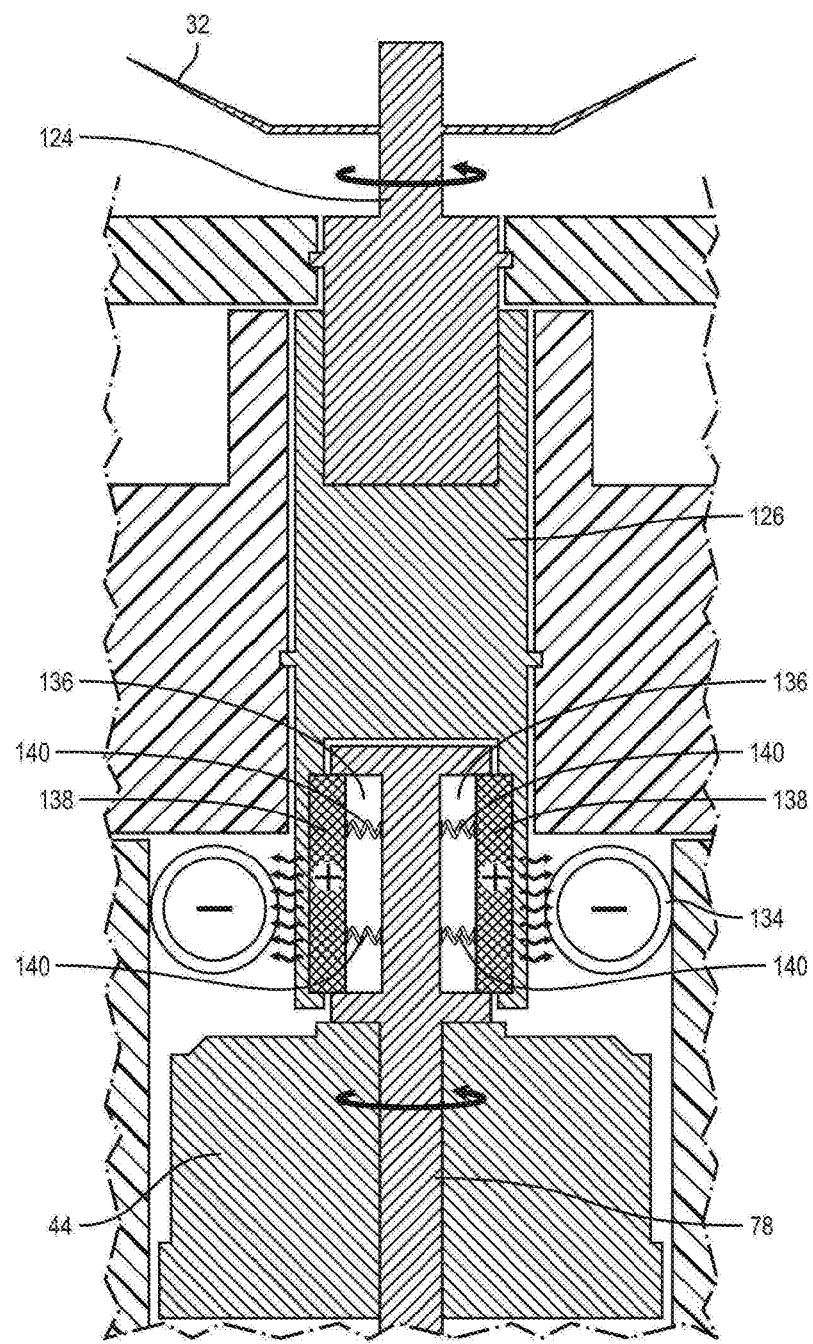
FIG. 18 is a cross sectional view of an electromagnetic clutch in accordance with an embodiment of the present invention.

In FIGS. 17 and 18 display an embodiment in which the spring mechanism 140 connects the bar armature 138 to a back wall 142 of the storage chamber 136. The weakness of this design is that over time, the spring mechanism 140 may deform due to excess extension to the point that it does not fully retract if the spring mechanism 140 is not stiff enough. An alternative design is shown in FIGS. 19 and 20 in which a flange 144 extends from each end of the bar armature 138. The storage chambers 136 have a lip 178 on each end that oppose the corresponding flange 144. The spring mechanism 140 is disposed between the flange 144 and the lip 178. This embodiment permits the spring mechanism 138 to be under compression rather than extension when the electromagnet 134 is energized as shown in FIG. 20. This embodiment provides better biasing forces to keep the bar armature 138 in the storage chamber 136 when the electromagnet 134 is turned off as shown in FIG. 19.

Figure 21:
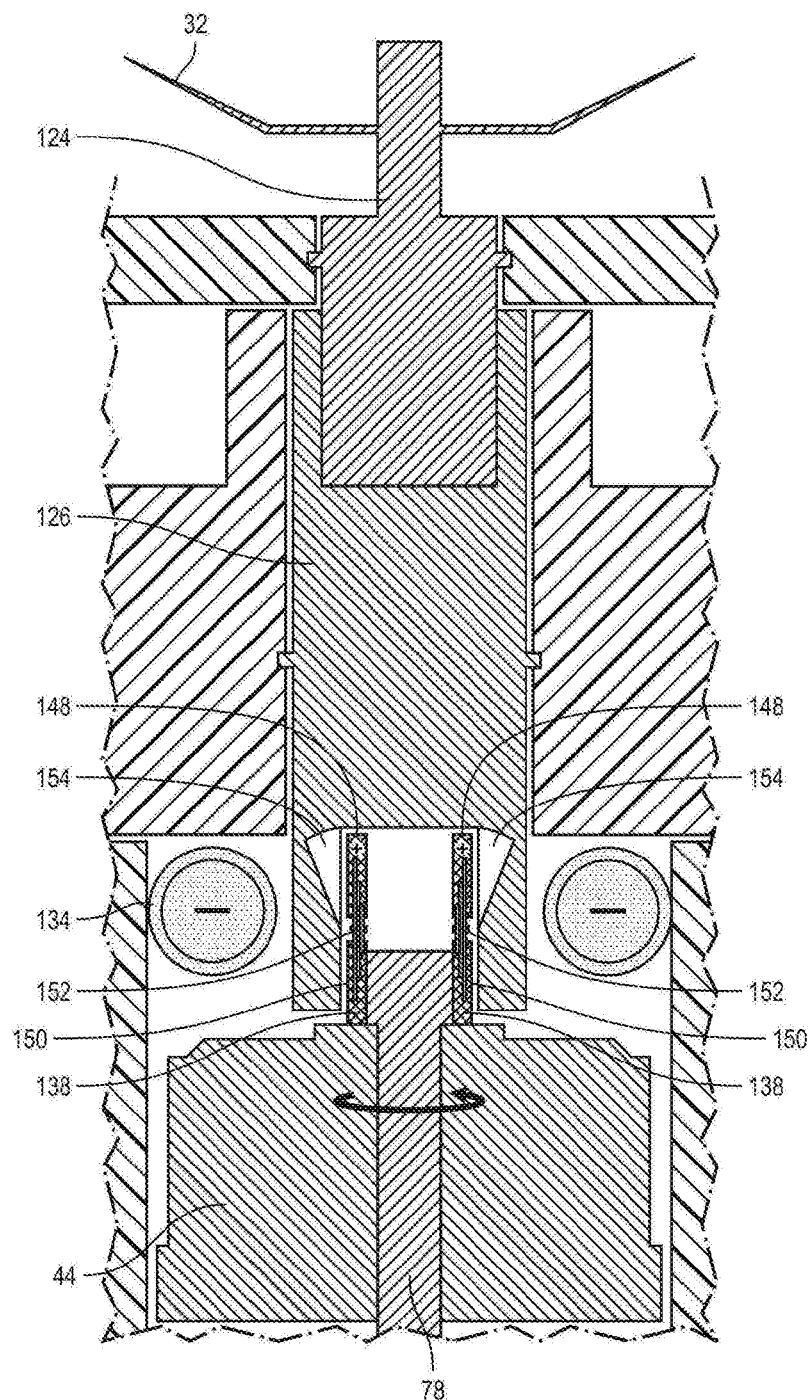
FIG. 21 is a cross sectional view of an electromagnetic clutch in accordance with an embodiment of the present invention.
Figure 22:
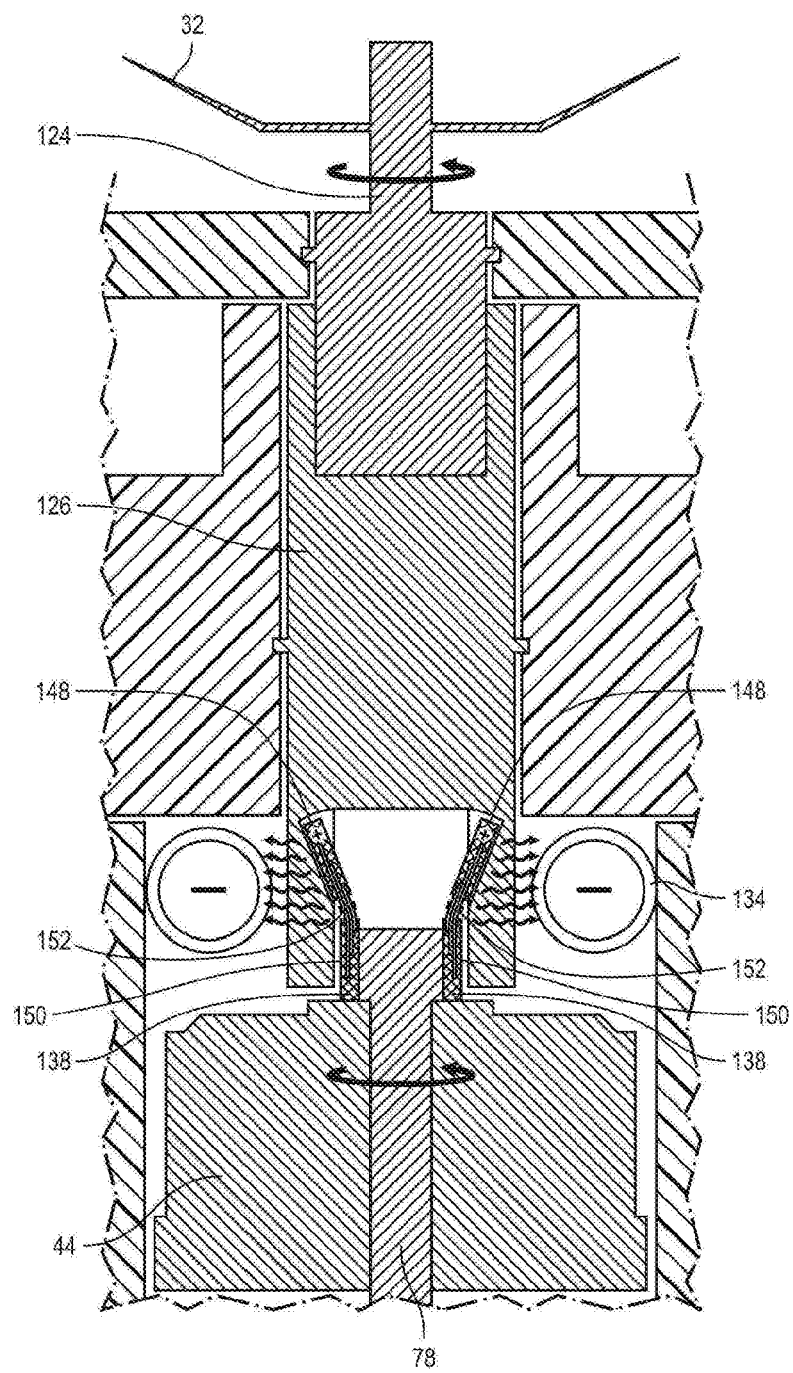
FIG. 22 is a cross sectional view of an electromagnetic clutch in accordance with an embodiment of the present invention.

FIGS. 21 and 22 display an embodiment in which the storage chambers 136 are not necessary. In this embodiment, the bar armatures 138 are secured to the top of the motor drive shaft 78. Each bar armature 138 has an upper portion 148 and a lower portion 150. To join the upper and lower portions 148, 150 together, a leaf spring 152, or equivalent resilient material, is inserted into, or secured to, the upper portion 148 and lower portion 148 of the bar armature 138. The clutch shaft 126 has angled recesses 154 for receiving the upper portion 148 of the bar armature 138. When the electromagnet 134 is not energized, the bar armatures 138 are in the vertical position as shown in FIG. 21 in which the bar armatures 138 do not engage the clutch shaft 126. In this position, only the fan 40 and not the blade 32 rotate when the motor 44 is activated. When the electromagnet 134 is energized, the upper portion 148 of the bar armatures 138 bend to come into contact with the angled recesses 154 of the clutch shaft 126 as shown in FIG. 22 thereby magnetically connecting the motor shaft 78 to the clutch shaft 126. In this position, both the fan 40 and the blade 32 rotate when the motor 44 is activated. As with other embodiments, the power to the electromagnet 134 can be controlled by a PCB 95 or can be controlled by manual switches.

Figure 23:
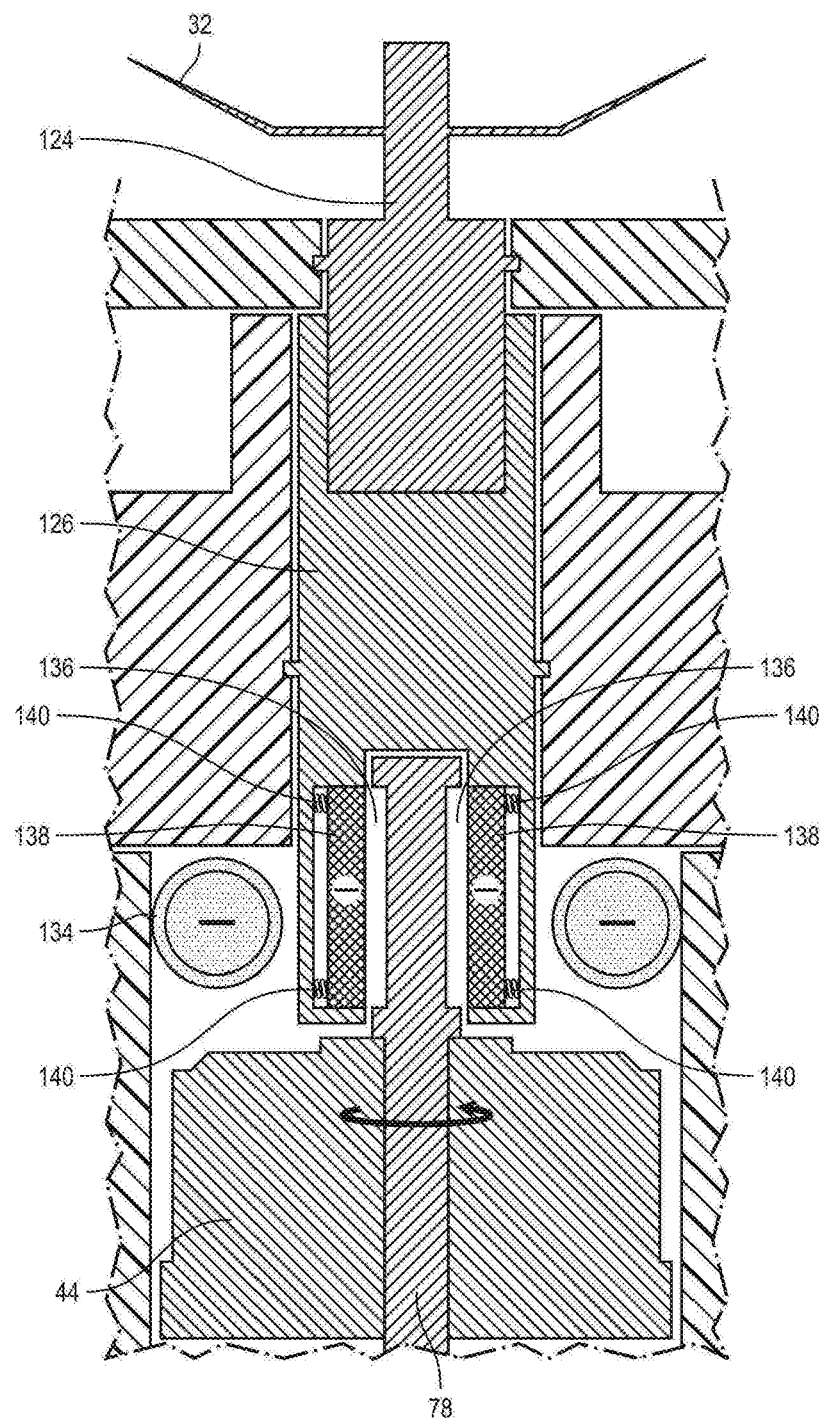
FIG. 23 is a cross sectional view of an electromagnetic clutch in accordance with an embodiment of the present invention.
Figure 24:
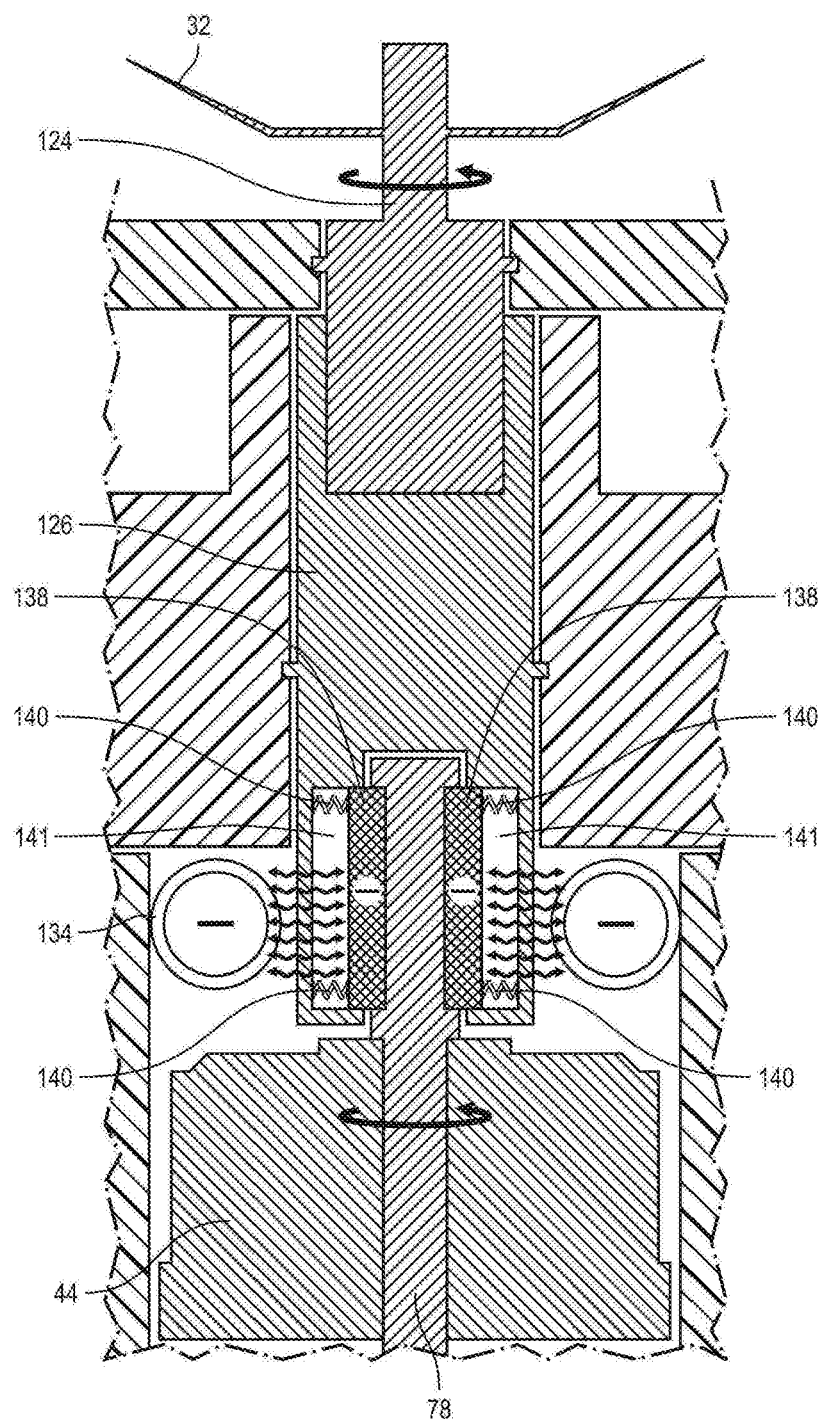
FIG. 24 is a cross sectional view of an electromagnetic clutch in accordance with an embodiment of the present invention.

FIGS. 23 and 24 illustrate an embodiment that is a variation on the embodiment in FIGS. 19 and 20 in that the polarity of the bar armature has been reversed so that the electromagnet 134 repels the bar armature 138 as shown in FIG. 24. This embodiment also requires the reversal of the attachment points of the spring mechanism so the spring mechanism is attached to the clutch chamber 141 rather than the storage chamber 136. As a result, the electromagnet 134 when activated repels the bar armature 138 into the storage chamber 136 as shown in FIG. 24, thereby engaging the clutch shaft 126 to operate the blade 32.

Telescoping Axial Screw Embodiments of Gear System

Figure 25:
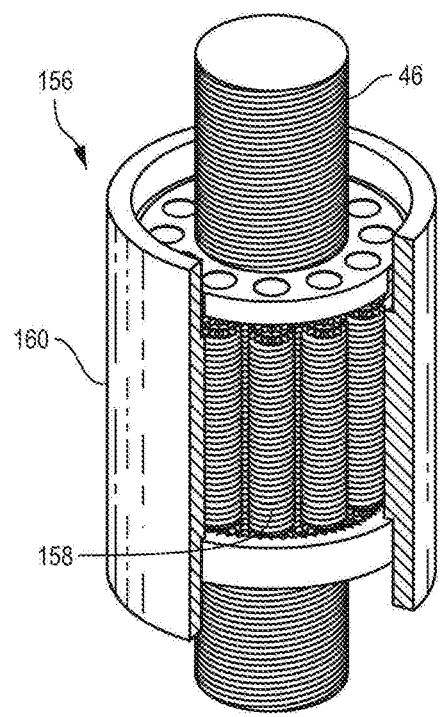
FIG. 25 is a dissected view of a planetary screw in accordance with an embodiment of the present invention.

There is another category of mechanisms that can be used to selectively engage the blade shaft 124. This other category involves gear systems that are capable of telescoping the motor shaft 78 upward and downward just enough to engage and disengage the blade shaft 124. The telescoping of the motor shaft 78 can be accomplished by various gear systems such as the planetary roller screw 156 shown in FIG. 25 in which a portion of the motor shaft 78 is threaded to serve as the screw shaft, which is surrounded by the planetary screws 158 contained within a planetary housing 160. Planetary roller screws are described in U.S. Pat. No. 2,683,379 and incorporated by reference. By mounting the planetary housing 160 in a stationary position, the motor or screw shaft can move axially to engage and disengage the blade shaft 124. Planetary roller screw systems are generally considered to be more expensive design choices.

Figure 26:
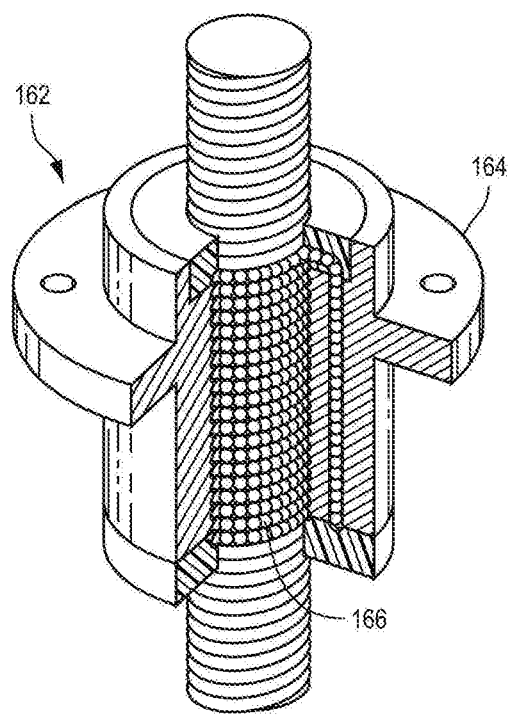
FIG. 26 is a dissected view of a ball screw in accordance with an embodiment of the present invention.

A ball screw system 162 as shown FIG. 26 is a preferred gear system for axial motion from a cost perspective. The ball screw system is comprised of a ball screw housing 164, which surrounds the threaded motor shaft 78, and the recirculating ball bearings 166. Such a ball screw system is described in U.S. Pat. No. 5,337,627 and is incorporated by reference. By mounting the ball screw housing 160 in a stationary position, the motor shaft 78 can move axially to engage and disengage the blade shaft 124.

Special Embodiments of the Evacuation Aperture

In the vessel 12 having the inverted design shown in FIGS. 1, 2, 3, 8, 9, and 10, the vessel conduit 22 has an evacuation aperture 36 in proximity to the bottom 16 of the vessel 12, which as previously explained becomes the top of the vessel 12 when inverted to be mounted on the motor base 20. In the embodiments shown FIGS. 8 and 9, the aperture 36 includes a splash shield 106 having a plurality of perforations formed therein. This configuration permits removal of the air from the vessel 12 during the evacuation phase while limiting food particles from entering the vessel conduit 22 during the blending phase. The splash shield 106 can be integrally formed with the vessel 12 or it can be made as a stopper that can be removed to flood the conduit 22 during cleaning. In that case, the splash shield 106 can be made of plastic, rubber, silicone, or other suitable kitchen grade material. The key to the success of the optional splash shield 106 is that the perforations allow for air to be suctioned into the vessel conduit while limiting food particles from entering the conduit 22 during blending.

Figure 8A:
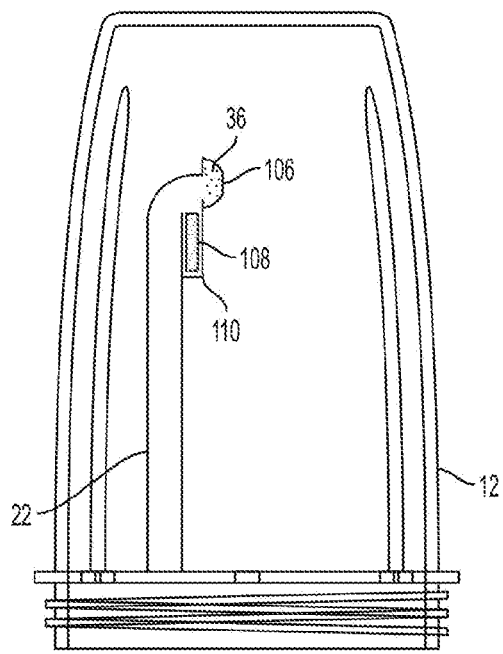
FIG. 8A is a side view of the operation of the gravity gate in accordance with an embodiment of the present invention where the cup is oriented in an inverted position.
Figure 8B:
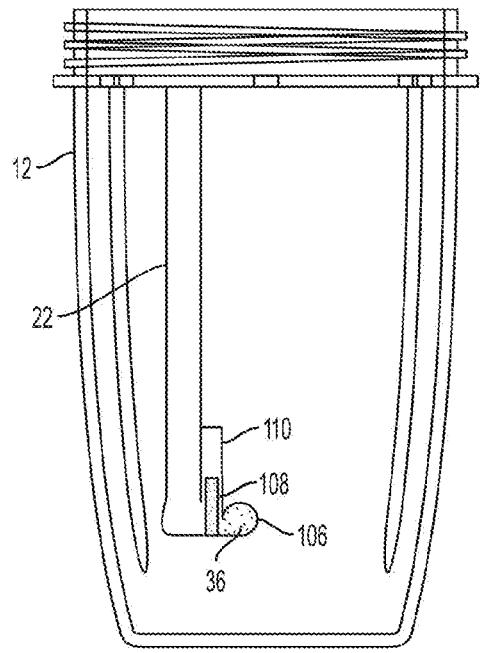
FIG. 8B is a side view of the operation of the gravity gate in accordance with an embodiment of the present invention where the cup is oriented in a drinking position.

The invention can also have an optional gravity gate 108 as shown in FIGS. 8 and 9. The gravity gate 108 is positioned in proximity to the evacuation aperture 36 in order for the gate 108 to close the aperture 36. The gravity gate 108 can be located in a channel 110 adjacent to the vessel conduit 22. In such a configuration, the gate 108 is weighted so that it falls to the closed position when the vessel is oriented in the drinking position as shown in FIG. 8B and falls to the open position when the vessel is inverted in the blending position as shown in FIG. 8A. The gate 108 is preferably made of stainless steel, but can be made of any food grade material of sufficient weight to move in the channel 110 in response to gravity and remain in the desired position until moved. This prevents the fluid in the blended drink from entering the vessel conduit 22 during drinking, but allows for removal of air during the evacuation phase.

Figure 9A:
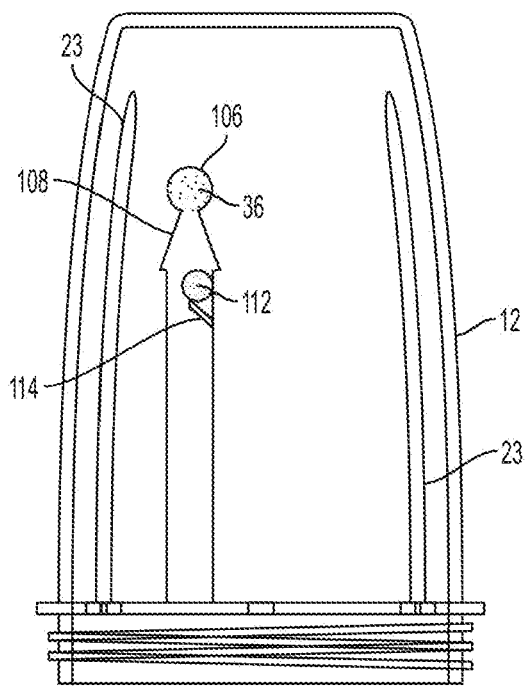
FIG. 9A is a side view of the operation of the ball gate in accordance with an embodiment of the present invention where the cup is oriented in an inverted position.
Figure 9B:
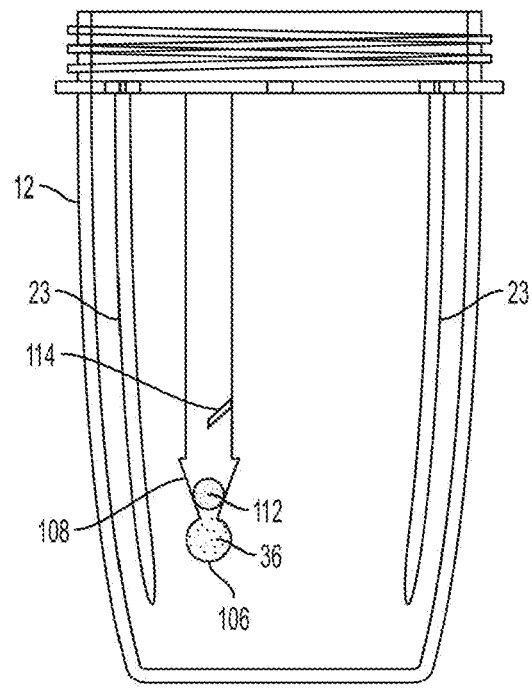
FIG. 9B is a side view of the operation of the ball gate in accordance with an embodiment of the present invention where the cup is oriented in a drinking position.

The gravity gate 108 can also be constructed using a weighted ball 112, such as stainless steel, within the vessel conduit 22. In this embodiment, the gravity gate 108 is comprised of a region of the vessel conduit 22, which is tapered toward the conduit aperture 36. The weighted ball 112 has a smaller diameter than the diameter of the vessel conduit 22 so that air can pass by the ball 112 during evacuation of the vessel 12. But in the region in which the vessel conduit 22 is tapered, the ball 112 has a greater diameter than at least a portion of the tapered region. In such a configuration, the ball 112 falls to the closed position when the vessel is oriented in the drinking position as shown in FIG. 9B and falls to the open position when the vessel is inverted in the blending position as shown in FIG. 9A. A collar 114, or other blocking structure, can be positioned within the vessel conduit 22 so that the weighted ball 112 does not fall the entire length of the conduit when in the open position. The sum of the total width of the collar 114 and the diameter of the ball 112 must be less than the interior diameter of the vessel conduit 22 to permit air to pass by during evacuation. The gravity gate 108 is not essential to the invention because the vessel conduit 22 can be rinsed out if food particles enter the vessel conduit 22, but it is useful to prevent clogging and limit the need for regularly cleaning the vessel conduit 22.

Figure 15:
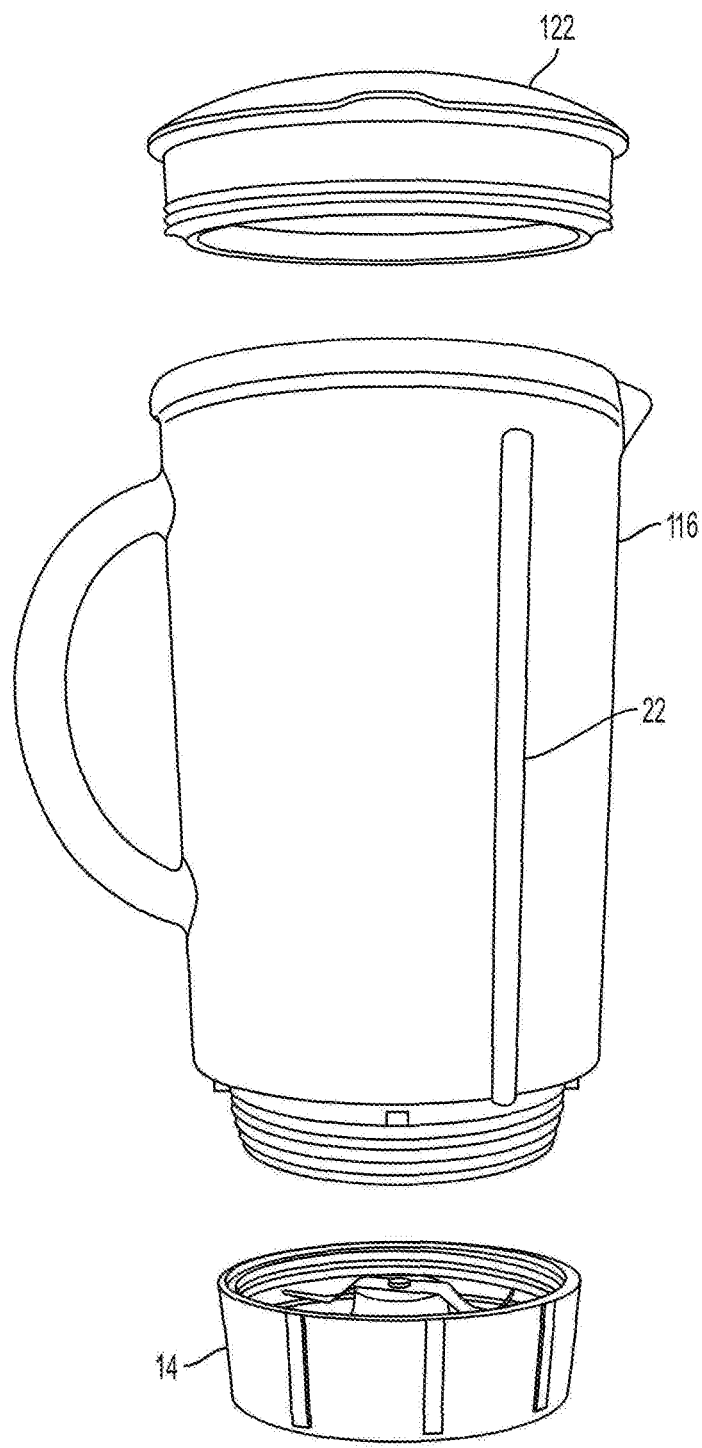
FIG. 15 is an exploded perspective view of a top loading blender vessel in accordance with an embodiment of the present invention.

The invention has been described primarily with respect to vessels 12 having an inverted configuration such as shown in FIG. 2. But the invention can employ an conventional blender vessel 116 as shown in FIG. 20. The vessel conduit 22 can be incorporated into such a conventional blender vessel 116 have a blade holder 14 removably secured to the bottom of the blender vessel 116 and a top 122 removably attached to the top of the vessel 116 as shown in FIG. 15. All other elements of the invention can interact with the conventional blender vessel 116.

The foregoing description of the embodiments of the present invention has been presented for the purpose of illustration and description. It is not intended to be exhaustive or to limit the invention to the precise form disclosed. Many modifications and variations are possible in light of the above teachings. Those of skill in the art will appreciate that the various embodiments can be modified using common knowledge and the teachings herein can be combined together to create other embodiments that still fall within the scope of the present invention, and such design choices should not be interpreted as causing a departure from the scope of the present disclosure. It is intended that the scope of the present invention not be limited by this detailed description, but by the claims and the equivalents to the claims appended hereto.

I claim:

1. A vacuum blender comprising:
a vessel having walls and an interior space, a blade holder assembly having a blade, a blade drive shaft, and a motor base,
said vessel having an end adapted for receiving said blade holder assembly;
said motor base containing a motor having a shaft adapted to engage said blade drive shaft, said motor base having a descending conduit;
said motor connected to a fan for evacuating air from said motor base;
a conduit system having a vessel conduit contained in said walls of said vessel connected to a descending conduit through which air can flow from the interior of said vessel to a three way valve;
said three way valve connected to an exhaust conduit and connected to a vacuum conduit, said vacuum conduit positioned in proximity to said fan to permit said fan to draw air from said vacuum conduit;
a gear system for permitting said motor to activate said fan to evacuate said vessel without rotating said blade, and said gear system permitting activation of said blade after initial activation of said fan; thereby resulting in evacuation of said vessel before blending occurs.

2. The vacuum blender of claim 1 in which said gear system is a clutch.

3. The vacuum blender of claim 1 in which said gear system is time delay gear.

4. The vacuum blender of claim 1 in which said three way valve includes a solenoid capable of opening and closing said valve.

5. The vacuum blender of claim 1 in which said gear system is controlled by instructions received from a PCB.

6. The vacuum blender of claim 1 in which said conduit system includes a vessel conduit having an open end capable of being opened or closed by a gravity gate.

7. The vacuum blender of claim 1 in which said conduit system includes a vessel conduit having an open end protected by a splash shield.

8. The vacuum blender of claim 1 in which said points of contact between said gear system and said blade drive shaft include bonded materials selected from the group comprised of tungsten carbide (WC), aluminum oxide ($Al_2O_3$), chromium nitride (CrN), titanium diboride ($TiB_2$), silicon dioxide ($SiO_2$), and/or combinations thereof.

9. The vacuum blender of claim 1 in which said points of contact between said clutch system and said blade drive shaft include bonding material powders selected from the group comprised of NiCrAlY, NiCrAl, NiCr, and Ti, and/or combinations thereof.

10. The vacuum blender of claim 1 in which said points of contact between said clutch system and said blade drive shaft include coatings selected from the group comprised of ceramic coatings and organic coatings.

11. A vacuum blender having a vessel, a motor base containing a motor, a motor drive shaft, a blade holder having a blade with a blade shaft for engaging said motor drive shaft, a fan connected to said motor drive shaft, the improvement comprising:
a conduit system defining an air passage from said vessel to said fan, said conduit system including a Venturi valve located in proximity to said fan for evacuating air from said vessel.

12. The vacuum blender of claim 11 in which a gear system is interposed between said motor drive shaft and said blade shaft to permit said motor to selectively actuate said fan to evacuate said vessel without rotating said blade and to permit activation of said blade after initial activation of said fan, thereby resulting in evacuation of said vessel before blending occurs.

13. The vacuum blender of claim 12 in which said gear system is a spring clutch.

14. The vacuum blender of claim 12 in which said gear system is an electromagnetic clutch.

15. The vacuum blender of claim 12 in which said gear system is a telescoping gear system selected from the group consisting of planetary screw shaft system, a ball screw shaft system, a rack and pinion system or a spring loaded solenoid system.

16. A vacuum blender having a vessel, a motor base containing a motor, a blade holder having a blade with a blade shaft for engaging a motor drive shaft, a fan connected to said motor drive shaft, said fan having an intake side, the improvement comprising:
a gear system interposed between said motor drive shaft and said blade shaft to permit said motor to actuate said fan and said blade separately or together; and,
a conduit system connected to a three way valve in proximity to said fan.

17. The vacuum blender of claim 16 in which said vacuum blender includes a conduit system connected to a three way valve in proximity to said fan.

18. The vacuum blender of claim 16 in which said vacuum blender includes a conduit system in which a portion of said conduit system is narrower than the remaining portions and in which said conduit system terminates on said intake side of said fan.

19. The vacuum blender of claim 16 in which said gear system is controlled by firmware.

\* \* \* \* \*